(12) United States Patent
Lee et al.

(10) Patent No.: US 8,653,515 B2
(45) Date of Patent: Feb. 18, 2014

(54) THIN FILM TRANSISTOR AND THIN FILM TRANSISTOR ARRAY PANEL

(75) Inventors: Yong-Su Lee, Hwaseong-si (KR); Yoon Ho Khang, Yongin-si (KR); Se Hwan Yu, Seoul (KR); Chong Sup Chang, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 27 days.

(21) Appl. No.: 13/367,076

(22) Filed: Feb. 6, 2012

(65) Prior Publication Data

US 2013/0032794 A1    Feb. 7, 2013

(30) Foreign Application Priority Data

Aug. 4, 2011  (KR) .......................... 10-2011-0077917

(51) Int. Cl.
*H01L 29/10*  (2006.01)
(52) U.S. Cl.
USPC ................... 257/43; 257/40; 257/41; 257/42; 257/E29.296
(58) Field of Classification Search
USPC .......................................................... 257/43
See application file for complete search history.

(56) References Cited

U.S. PATENT DOCUMENTS 7,566,899 B2 *  7/2009  Chabinyc et al. ............... 257/40
2008/0157080 A1  7/2008  Gruner et al.
2010/0090759 A1  4/2010  Shin et al.
2012/0175608 A1 *  7/2012  Yamazaki ........................ 257/43
2012/0217500 A1 *  8/2012  Park et al. ........................ 257/59

FOREIGN PATENT DOCUMENTS

| JP | 2008-124450 | 5/2008 |
| JP | 2009-070881 | 4/2009 |
| JP | 2009-194372 | 8/2009 |
| JP | 2009-278057 | 11/2009 |
| KR | 10-2009-0113689 | 11/2009 |
| KR | 10-2011-0006539 | 1/2011 |

OTHER PUBLICATIONS

Chen-Guan lee, "Integration of reduced graphene oxide into organic field-effect transistors as conducting electrodes and as a metal modification layer", Jul. 14, 2009, 2009 American Institute of Physics, Applied Physics Letters, 95.*

(Continued)

*Primary Examiner* — Matthew W Such
*Assistant Examiner* — Frederick B Hargrove
(74) *Attorney, Agent, or Firm* — H.C. Park & Associates, PLC (57) ABSTRACT

Provided is a thin film transistor and thin film transistor panel array. The thin film transistor includes: a substrate; a gate electrode disposed on the substrate; a semiconductor layer disposed on the substrate and partially overlapping with the gate electrode; a source electrode and a drain electrode spaced apart from each other with respect to a channel region of the semiconductor layer; an insulating layer disposed between the gate electrode and the semiconductor layer; and a barrier layer disposed between the semiconductor layer and the source electrode and between the semiconductor layer and the drain electrode, in which the barrier layer comprises graphene. An ohmic contact is provided based on the type of material used for the semiconductor layer.

21 Claims, 10 Drawing Sheets

(56) References Cited

OTHER PUBLICATIONS

David Seo, "Fully transparent InGaZnO thin film transistors using indium tin oxide/graphene multilayer as source/drain electrodes", Oct. 27, 2012, American Institute of Physics, Applied Physics Letters, 97.*

Chen-Guan Lee, Integration of Reduced Graphene Oxide into Organic Field-Effect as Conducting Electrodes and as a Metal Modification Layer, Jul. 14, 2009 American Institute of Physics, Applied Physics Letters, 95.*

David Seo, "Fully Transpatent InGaZnO Thin Film Transistors using Indium Tin Oxide/Graphene Multilayer as Soucre/Drain Electrodes", Oct. 27, 2012, American institute of Physocs, Applied Physics Letters, 97.*

* cited by examiner

THIN FILM TRANSISTOR AND THIN FILM TRANSISTOR ARRAY PANEL

CROSS-REFERENCE TO RELATED APPLICATION

This application claims priority to and the benefit of Korean Patent Application No. 10-2011-0077917, filed on Aug. 4, 2011, which is hereby incorporated by reference for all purposes as if fully set forth herein.

BACKGROUND OF THE INVENTION

1. Field

Exemplary embodiments of the present invention relate to a thin film transistor and a thin film transistor array panel.

2. Discussion of the Background

In general, a flat panel display such as a liquid crystal display, an organic light emitting diode display, or the like includes a plurality of pairs of field generating electrodes and an electro-optical active layer interposed therebetween. The liquid crystal display includes a liquid crystal layer as the electro-optical active layer and the organic light emitting diode display includes an organic emission layer as the electro-optical active layer.

One of a pair of field generating electrodes is generally connected to a switching element to receive an electric signal and the electro-optical active layer converts the electric signal into an optical signal, thereby displaying an image.

In a flat panel display, a thin film transistor (TFT) is a three-terminal element that is typically used as the switching element. The flat panel display also includes signal lines, such as: a gate line that transfers a scanning signal for controlling the thin film transistor and a data line that transfers a signal applied to a pixel electrode.

As display devices become larger, in order to implement high-speed driving, an oxide semiconductor technology has been researched and a method for reducing resistance in signal lines has also been researched.

Recently, a method of replacing known metal wiring material with copper, which has better resistivity characteristics and better electromigration characteristics versus known metal wiring material has been proposed.

However, copper has weak adhesion with a glass substrate and it may diffuse to an insulating layer or a semiconductor layer even at a relatively low temperatures, such as—200° C., thereby making it substantially difficult to apply copper as a single metal wiring material.

Thus, in order to prevent diffusion, a barrier metal layer may be formed between the glass substrate and the gate wiring and between the semiconductor layer and the data wiring, which is a copper wiring structure that is capable of improving an adhesive characteristic and preventing diffusion to the semiconductor layer, has been proposed.

The above information disclosed in this Background section is only for enhancement of understanding of the background of the invention and therefore it may contain information that does not form the prior art that is already known in this country to a person of ordinary skill in the art.

SUMMARY OF THE INVENTION

The barrier layer, which may include various metals and metal materials, such as manganese, titanium, and the like, is provided to prevent diffusion of a metal material of the main wiring layer. However, in the case where an oxide semiconductor is used, there is a problem that a part of the constituent components of the oxide semiconductor is extracted due to a metal characteristic of bonding with oxygen. This causes a projection to be formed in an interface between the oxide semiconductor and the barrier layer.

Exemplary embodiments of the present invention provide a thin film transistor including a barrier layer that prevents a metal material of a main wiring layer from being diffused and reduces a foreign substance defect such as a projection, and a thin film transistor array panel directed towards the same.

It is to be understood that both the foregoing general description and the following detailed description are exemplary and explanatory and are intended to provide further explanation of the invention as claimed.

An exemplary embodiment of the present invention provides a thin film transistor including: a substrate; a gate electrode disposed on the substrate; a semiconductor layer disposed on the substrate, the semiconductor layer having a channel region; a source electrode and a drain electrode spaced apart from each other with respect to a channel region of the semiconductor layer; an insulating layer disposed between the gate electrode and the semiconductor layer; and a barrier layer disposed between the semiconductor layer and the source electrode and between the semiconductor layer and the drain electrode, wherein the barrier layer comprises graphene. The thin film transistor may further include a capping layer disposed on the source electrode and the drain electrode. The capping layer may comprises graphene. The barrier layer may contact the source electrode and the drain electrode. The thin film transistor may further include a passivation layer disposed on the capping layer. The passivation layer may contact an upper surface of the semiconductor layer corresponding to the channel region. The semiconductor layer may comprises an oxide semiconductor. The semiconductor layer may include at least one of zinc (Zn), indium (In), tin (Sn), gallium (Ga), and hafnium (Hf). The semiconductor layer may comprises amorphous silicon. The thin film transistor may further include an ohmic contact layer disposed between the semiconductor layer and the barrier layer. The source electrode and the drain electrode may include a lower layer including at least one of copper, manganese, and titanium and an upper layer disposed on the lower layer and the upper layer comprising copper. Another exemplary embodiment of the present invention provides a thin film transistor array panel including: a substrate; a gate line disposed on the substrate and a gate electrode, the gate line and the gate electrode being connected to each other; a gate insulating layer disposed on the gate line and the gate electrode; a semiconductor layer disposed on the gate insulating layer; a data line disposed on the semiconductor layer and a source electrode connected to the data line; a drain electrode spaced apart from the source electrode; a passivation layer disposed on the data line, the source electrode, and the drain electrode and having a contact hole; a pixel electrode disposed on the passivation layer and connected to the drain electrode through the contact hole; and a barrier layer disposed between the semiconductor layer and the source electrode and between the semiconductor layer and the drain electrode, wherein the barrier layer comprises graphene. The thin film transistor array panel may further include a capping layer disposed between the source electrode and the passivation layer and between the drain electrode and the passivation layer. The capping layer may comprises graphene. The barrier layer may contact the source electrode and the drain electrode. The passivation layer may contact an upper surface of the semiconductor layer, the semiconductor having a channel region. The semiconductor layer may comprises an oxide semiconductor. The semiconductor layer may include at least one of zinc (Zn), indium (In), tin (Sn), gallium (Ga), and hafnium (Hf). The semiconductor layer may be comprises amorphous silicon. The thin film transistor array panel may further include an ohmic contact layer disposed between the semiconductor layer and the barrier layer. The source electrode and the drain electrode may include a lower layer comprises at least one of copper, manganese, and titanium and an upper layer disposed on the lower layer, the upper layer comprising copper. According to exemplary embodiments of the present invention, it is possible to prevent diffusion of a wiring material by a barrier layer formed of graphene and prevent a projection from being generated when using an oxide semiconductor as a semiconductor layer.

Additional features of the invention will be set forth in the description which follows, and in part will be apparent from the description, or may be learned by practice of the invention.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 1:
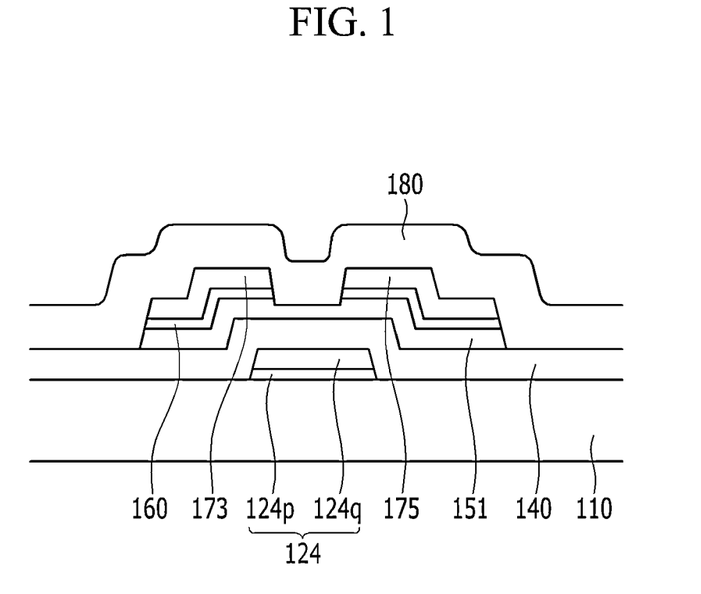
FIG. 1 is a cross-sectional view illustrating a thin film transistor according to an exemplary embodiment of the present invention.

FIG. 1 is a cross-sectional view illustrating a thin film transistor according to an exemplary embodiment of the present invention.

Referring to FIG. 1, a gate electrode 124 is disposed on an insulation substrate 110, which may be made of transparent glass or plastic. The gate electrode 124 may have a double-layer structure including a first layer 124$p$ and a second layer 124$q$. The first layer 124$p$ and the second layer 124$q$ may be made of an aluminum-based metal such as aluminum (Al), an aluminum alloy, and the like, silver-based metal such as silver (Ag), a silver alloy, and the like, copper-based metal such as copper (Cu), a copper alloy, and the like, molybdenum-based metal such as molybdenum (Mo), a molybdenum alloy, and the like, chromium (Cr), titanium (Ti), tantalum (Ta), manganese (Mn), and the like, respectively.

Further, the first layer 124$p$ and the second layer 124$q$ may be formed by combining other layers having different physical properties. The gate electrodes 124 are shown as being formed in the double-layer structure, but aspects of the disclosure are not limited thereto, and the gate electrodes 124 may be formed in other structures, such as a single-layer structure or triple-layer structure.

A gate insulating layer 140, which may be made of an insulating material such as silicon oxide or silicon nitride is disposed on the gate electrode 124.

A semiconductor layer 151 is formed on the gate insulating layer 140. The semiconductor layer 151 may be made of amorphous silicon, polycrystalline silicon, or an oxide semiconductor. If the semiconductor layer 151 is made of an oxide semiconductor, the semiconductor layer 151 may include at least one of zinc (Zn), indium (In), tin (Sn), gallium (Ga), and hafnium (Hf).

A barrier layer 160 is disposed on the semiconductor layer 151, and a source electrode 173 and a drain electrode 175 are disposed on the barrier layer 160.

The barrier layer 160 may be formed of graphene. The barrier layer 160 formed of graphene has a characteristic of an ohmic contact.

The source electrode 173 and the drain electrode 175 may be made of an aluminum-based metal such as aluminum (Al), an aluminum alloy, and the like, silver-based metal such as silver (Ag), a silver alloy, and the like, copper-based metal such as copper (Cu), a copper alloy such as copper manganese (CuMn), and the like, molybdenum-based metal such as molybdenum (Mo), a molybdenum alloy, and the like, chromium (Cr), tantalum (Ta), titanium (Ti), and the like, respectively. Further, the source electrode 173 and the drain electrode 175 may be made of a transparent conductive material such as Indium tin oxide (ITO), Indium Zinc oxide (IZO), and the like. The source electrode 173 and the drain electrode 175 may have a single layer structure or a multilayer structure including two or more conductive layers (not shown).

A passivation layer 180 is disposed on the source electrode 173 and the drain electrode 175. The passivation layer 180 may directly contact an upper side of the semiconductor layer 151 corresponding to a channel region of the semiconductor layer 151. The passivation layer 180 may be made of an inorganic insulator such as silicon nitride or silicon oxide, an organic insulator, and a low dielectric insulator. The passivation layer 180 may have a single layer structure or a multilayer structure.

In the thin film transistor, the barrier layer 160 is disposed between the semiconductor layer 151 and the source electrode 173 and between the semiconductor layer 151 and the drain electrode 175 such that metallic components of the source electrode 173 and the drain electrode 175 are not diffused to the semiconductor layer 151, thereby preventing the characteristics of the thin film transistor from being deteriorated.

Figure 2:
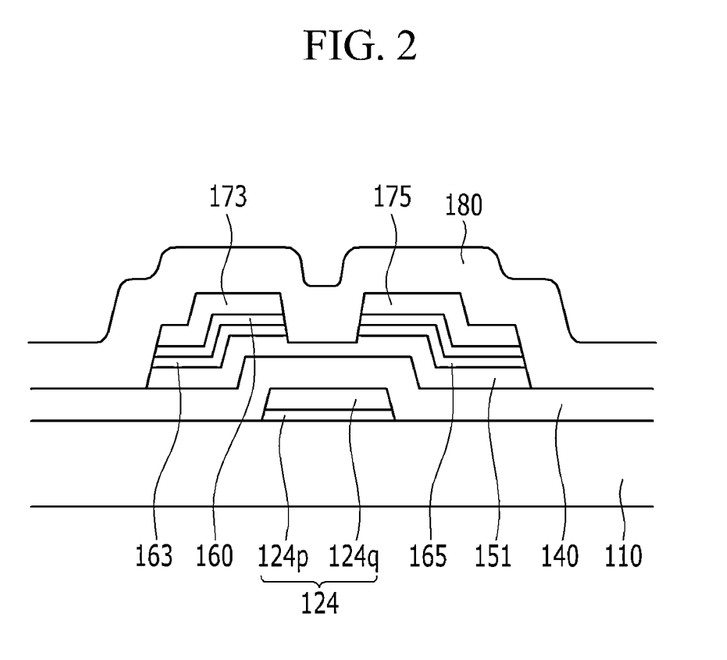
FIG. 2 is a cross-sectional view illustrating a thin film transistor according to an exemplary embodiment of the present invention.

FIG. 2 is a cross-sectional view illustrating a thin film transistor according to an exemplary embodiment of the present invention.

Referring to FIG. 2, the thin film transistor has almost the same configuration as the thin film transistor described in FIG. 1. However, the thin film transistor of FIG. 2 has a difference from the thin film transistor described in FIG. 1 in that ohmic contact layers 163 and 165 are disposed between the source electrode 173 and the semiconductor layer 151, and between the drain electrode 175 and the semiconductor layer 151. In this case, the semiconductor layer 151 may be made of amorphous silicon. Accordingly, except for this difference, the disclosure associated with the thin film transistor of FIG. 1 may be applied to the thin film transistor of FIG. 2. Although ohmic contact layers 163 and 165 are shown as being disposed between the barrier layer 160 and the semiconductor layer 151, the barrier layer 160 may be disposed between ohmic contact layers 163 and 165 and the semiconductor layer 151.

Figure 3:
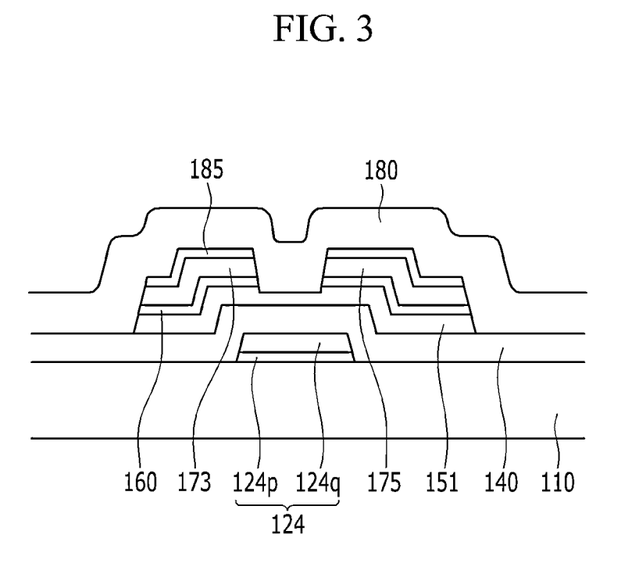
FIG. 3 is a cross-sectional view illustrating a thin film transistor according to an exemplary embodiment of the present invention.

FIG. 3 is a cross-sectional view illustrating a thin film transistor according to an exemplary embodiment of the present invention.

Referring to FIG. 3, the thin film transistor has almost the same configuration as the thin film transistor described in FIG. 1. However, the thin film transistor of FIG. 3 has a difference from the thin film transistor described in FIG. 1 in that a capping layer 185 is disposed between the passivation layer 180 and the source electrode 173, and between the passivation layer 180 and the drain electrode 175. The capping layer 185 may be made of graphene. Since the thin film transistor includes the capping layer 185, the metallic components of the source electrode 173 and the drain electrode 175 are blocked from being diffused, and it is possible to prevent the source electrode 173 and the drain electrode 175 from being oxidized due to a material such as oxygen, which may be generated in the formation process of the passivation layer 180 interacting with the electrodes.

Accordingly, except for this difference, the disclosure associated with the thin film transistor of FIG. 1 may be applied to the thin film transistor of FIG. 3. Although not shown, the TFT of FIG. 3 may further include ohmic contact layer 163 disposed between the source electrode 173 and the semiconductor layer 151 and ohmic contact layer 165 disposed between the drain electrode 175 and the semiconductor layer 151, similar to the previous exemplary embodiment.

Figure 4:
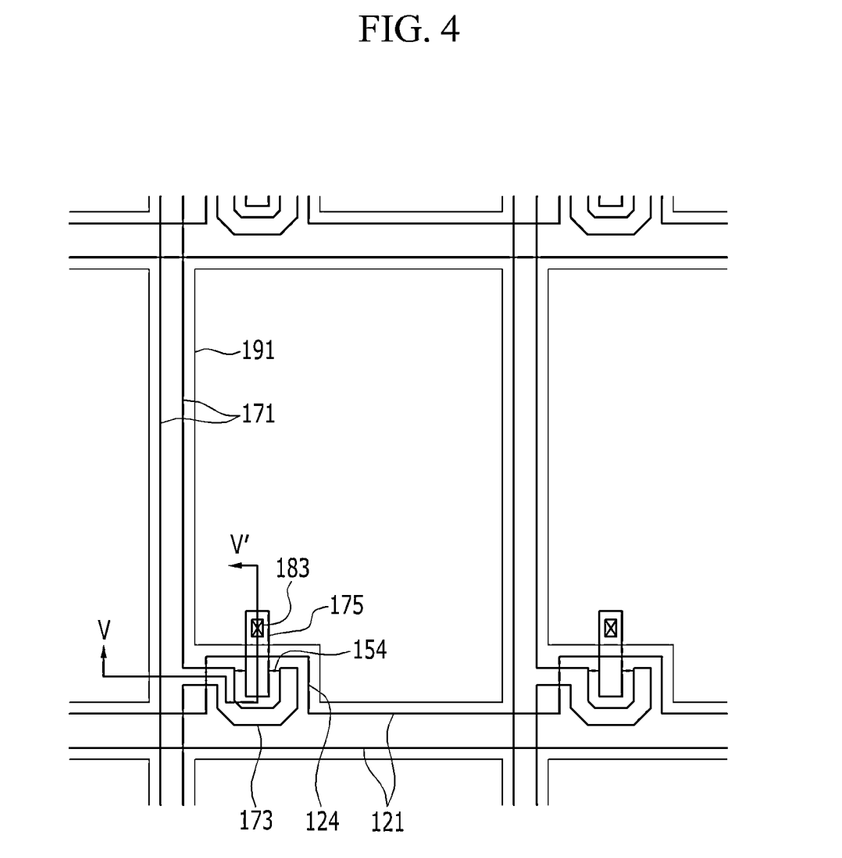
FIG. 4 is a layout view showing one pixel of a thin film transistor array panel according to an exemplary embodiment of the present invention.
Figure 5:
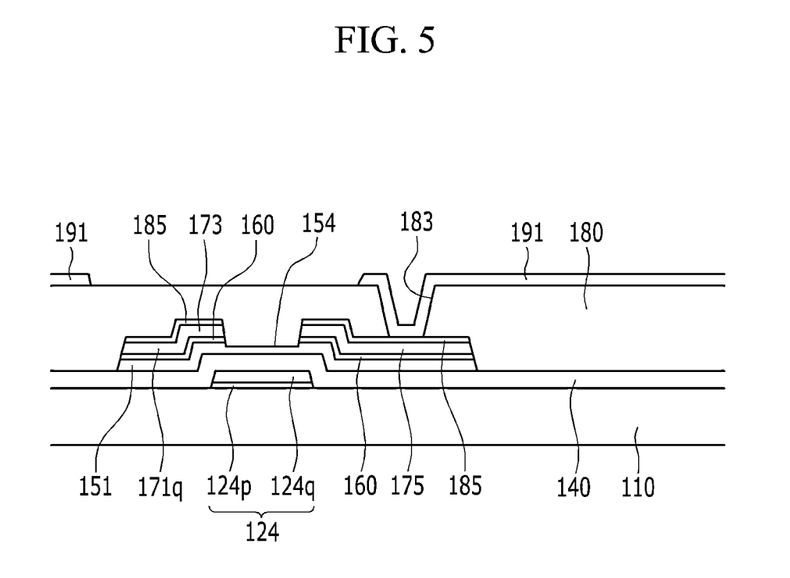
FIG. 5 is a cross-sectional view taken along line V-V' of FIG. 4.

FIG. 4 is a layout view showing one pixel of a thin film transistor array panel according to an exemplary embodiment of the present invention. FIG. 5 is a cross-sectional view taken along line V-V' of FIG. 4.

Referring to FIG. 4 and FIG. 5, a plurality of gate lines 121 are formed on an insulation substrate 110, which may be made of transparent glass or plastic.

The gate lines 121 transfer gate signals and mainly extend in a horizontal direction. Each gate line 121 includes a plurality of gate electrodes 124 protruding from the gate line 121.

The gate lines 121 and the gate electrodes 124 may have a double-layered structure configured by first layers 121p and 124p and second layers 121q and 124q. The first layers 121p and 124p and the second layers 121q and 124q may be made of an aluminum-based metal such as aluminum (Al), an aluminum alloy, and the like, silver-based metal such as silver (Ag), a silver alloy, and the like, copper-based metal such as copper (Cu), a copper alloy, and the like, molybdenum-based metal such as molybdenum (Mo), a molybdenum alloy, and the like, chromium (Cr), titanium (Ti), tantalum (Ta), manganese (Mn), and the like, respectively.

Further, the first layers 121p and 124p and the second layers 121q and 124q may be formed by combining other layers having different physical properties. As shown, the gate lines 121 and the gate electrodes 124 are formed as double-layer structures; however, aspects of the disclosure are not limited thereto, the gate lines 121 and gate electrodes 124 may be formed as a single-layer structure or a multilayer structure.

A gate insulating layer 140, which may be made of an insulating material, such as silicon oxide or silicon nitride, is disposed on the gate line 121 and the gate electrode 124.

A semiconductor layer 151 is formed on the gate insulating layer 140. The semiconductor layer 151 mainly extends in a vertical direction and includes a plurality of projections 154 protruding toward the gate electrode 124.

The semiconductor layer 151 and the projections 154 may be formed by amorphous silicon, polycrystalline silicone, or an oxide semiconductor. If the semiconductor layer 151 and the projections 154 are formed of the oxide semiconductor, the semiconductor layer 151 and the projections 154 may include at least one of zinc (Zn), indium (In), tin (Sn), gallium (Ga), and hafnium (Hf).

A barrier layer 160 is disposed on the semiconductor layer 151. A data line 171, a source electrode 173 connected to the data line 171, and a drain electrode 175 which is spaced apart from the source electrode 173 with respect to the channel region corresponding to the projection 154 of the semiconductor layer 151, are disposed on the barrier layer 160.

The barrier layer 160 is made of graphene. The barrier layer made of graphene may substitute for known barrier layers made of titanium or the like. By forming the barrier layer by graphene, a foreign substance defect which is generated by the known barrier layers can be reduced.

Herein, the foreign substance defect refers to a part of the metallic components of the oxide semiconductor being extracted due to a property of titanium (and other substances in known barrier layers), in that the metallic components bond with oxygen so as to form a protrusion in an interface between the oxide semiconductor and the barrier layer, if using an oxide semiconductor as the semiconductor layer. As a result, a characteristic of the thin film transistor may be deteriorated.

If the semiconductor layer 151 is made of amorphous silicon, an ohmic contact layer (as shown in FIG. 2) may be disposed between the source electrode 173 and the semiconductor layer 151 and between the drain electrode 175 and the semiconductor layer 151 to lower contact resistance therebetween.

The data lines 171 transfer data signals and mainly extend in a vertical direction to cross the gate lines 121. A plurality of source electrodes 173 extending toward the gate electrode 124 to have a U-shape may be connected to the data line 171.

Various orientations are provided for the disclosed signal lines; however, aspects of the disclosure are not limited to the orientations used in disclosing the exemplary embodiment.

The drain electrode 175 is separated from the data line 171 and extends toward the upper side from the center of the U-shape of the source electrodes 173.

The data line 171, the source electrode 173, and the drain electrode 175 may be made of an aluminum-based metal such as aluminum (Al), an aluminum alloy, and the like, silver-based metal such as silver (Ag), a silver alloy, and the like, copper-based metal such as copper (Cu), a copper alloy such as copper manganese (CuMn), and the like, molybdenum-based metal such as molybdenum (Mo), a molybdenum alloy, and the like, chromium (Cr), tantalum (Ta), titanium (Ti), and the like, respectively. Further, the source electrode 173 and the drain electrode 175 may be made of a transparent conductive material such as Indium tin oxide (ITO), Indium Zinc oxide (IZO), and the like. The source electrode 173 and the drain electrode 175 may have a single structure or a multi-layer structure including two or more conductive layers (not shown).

A capping layer 185 is disposed on the data line 171, the source electrode 173, and the drain electrode 175. The capping layer 185 may be made of graphene.

An exposed portion which is not covered by the source electrode 173 and the drain electrode 175 is disposed between the source electrode 173 and the drain electrode 175 in the projection 154 of the semiconductor layer 151. The semiconductor layer 151 has substantially the same planar pattern as the data line 171, the source electrode 173, and the drain electrode 175, except for the exposed portion corresponding to the projection 154.

One gate electrode 124, one source electrode 173, and one drain electrode 175 form one thin film transistor (TFT). The TFT also includes the projection 154 of the semiconductor layer 151, and a channel region of the thin film transistor is formed at the projection 154 between the source electrode 173 and the drain electrode 175.

A passivation layer 180 is formed on the data line 171, the source electrode 173, the drain electrode 175, and the exposed projection 154 of the semiconductor layer 151. The passivation layer 180 may be made of an inorganic insulator such as silicon nitride or silicon oxide, an organic insulator, and a low dielectric insulator.

Lifting may occur due to copper oxide (CuOx) generated by directly contacting the data line 171, the source electrode 173, the drain electrode 175 (which are made of a metal material), with the passivation layer 180, when disposing or forming the passivation layer. Further, corrosion may occur when a contact hole 183 (described below) is formed at the passivation layer 180. However, disposing a capping layer 185 made of graphene below the passivation layer 180 may prevent lifting and corrosion in the data line 171, the source electrode 173, and the drain electrode 175.

Alternatively, the capping layer 185 may be omitted and the passivation layer 180 may be disposed directly on the source electrode 173 and the drain electrode 175.

A plurality of contact holes 183, that expose one end of the drain electrode 175, are formed at the passivation layer 180.

A pixel electrode 191 is formed on the passivation layer 180. The pixel electrode 191 is physically and electrically connected with the drain electrode 175 through the contact hole 183 and receives data voltage from the drain electrode 175. The pixel electrode 191, to which the data voltage is applied, generates an electric field together with a common electrode that receives common voltage (not shown and may be formed on an opposed display panel or a thin film transistor array panel), thereby determining a direction of liquid crystal molecules of a liquid crystal layer (not shown) interposed between the two electrodes. The pixel electrode 191 and the common electrode form a capacitor (hereinafter, referred to as a "liquid crystal capacitor") and maintain the applied voltage even after the thin film transistor is turned off.

The pixel electrode 191 may form a storage capacitor by overlapping with a storage electrode line (not shown) and the voltage storage capacity of the liquid crystal capacitor may be reinforced therethrough.

The pixel electrode 191 may be made of a transparent conductor such as ITO or IZO.

A thin film transistor array panel of the liquid crystal display is described above, but the same contents may be applied to an organic light emitting diode display as well.

Figure 6:
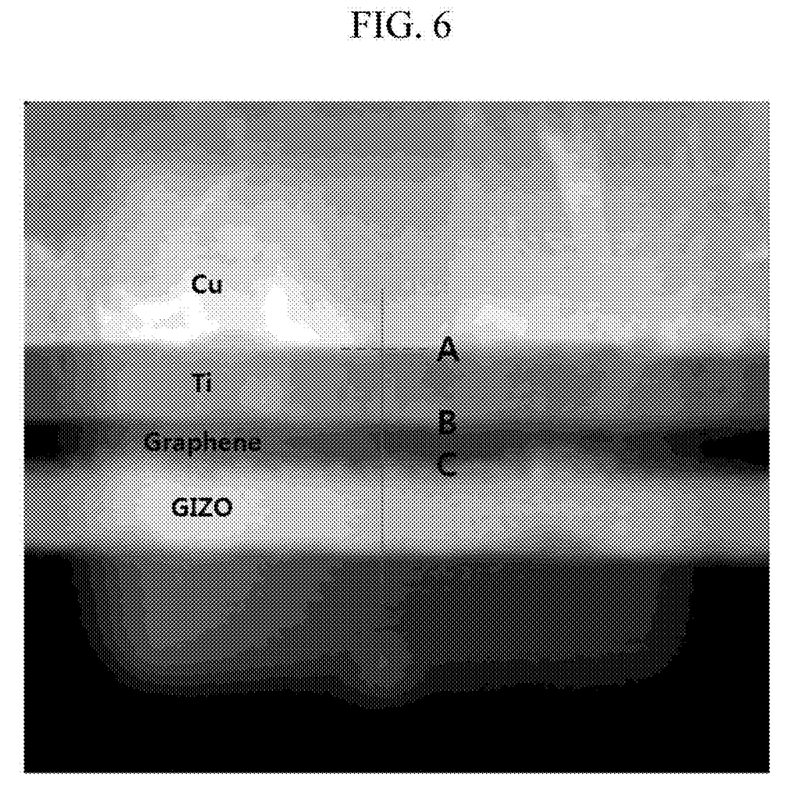
FIG. 6 is an electron micrograph of a thin film transistor structure using graphene as a barrier layer, according to an exemplary embodiment of the present invention.
Figure 7:
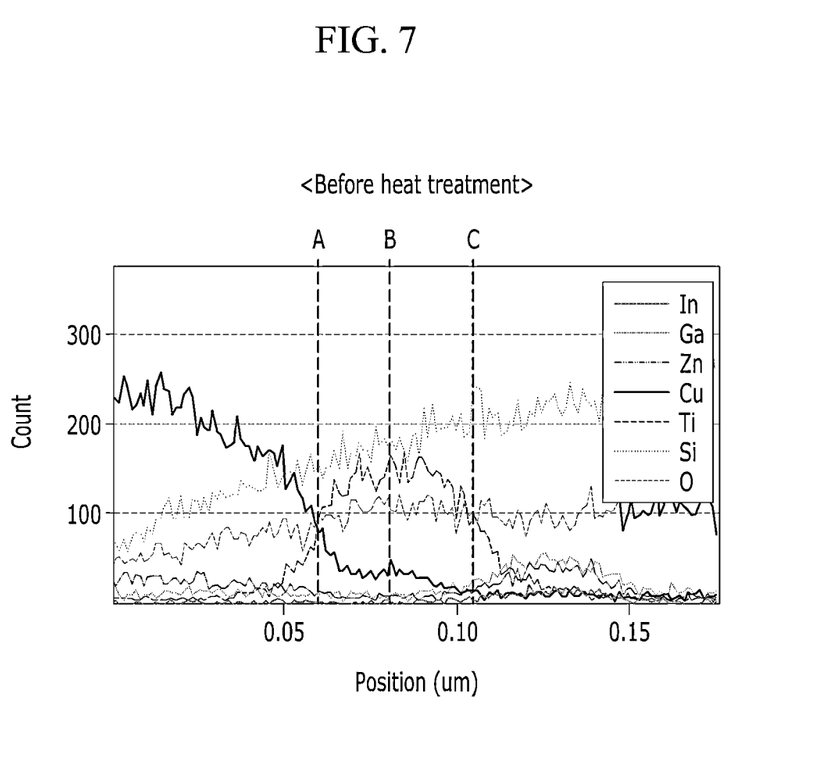
FIG. 7 is a graph illustrating a count of constituent materials of a thin film transistor before heat treatment according to A, B, and C positions of FIG. 6.

FIG. 6 is an electron micrograph of a thin film transistor structure using graphene as a barrier layer, according to an exemplary embodiment of the present invention. FIG. 7 is a graph illustrating a count of constituent materials of a thin film transistor before heat treatment according to A, B, and C positions of FIG. 6.

Referring to FIG. 6 and FIG. 7, a count of materials which form each layer of a thin film transistor including a barrier layer made of graphene before heat treatment is shown.

Figure 8:
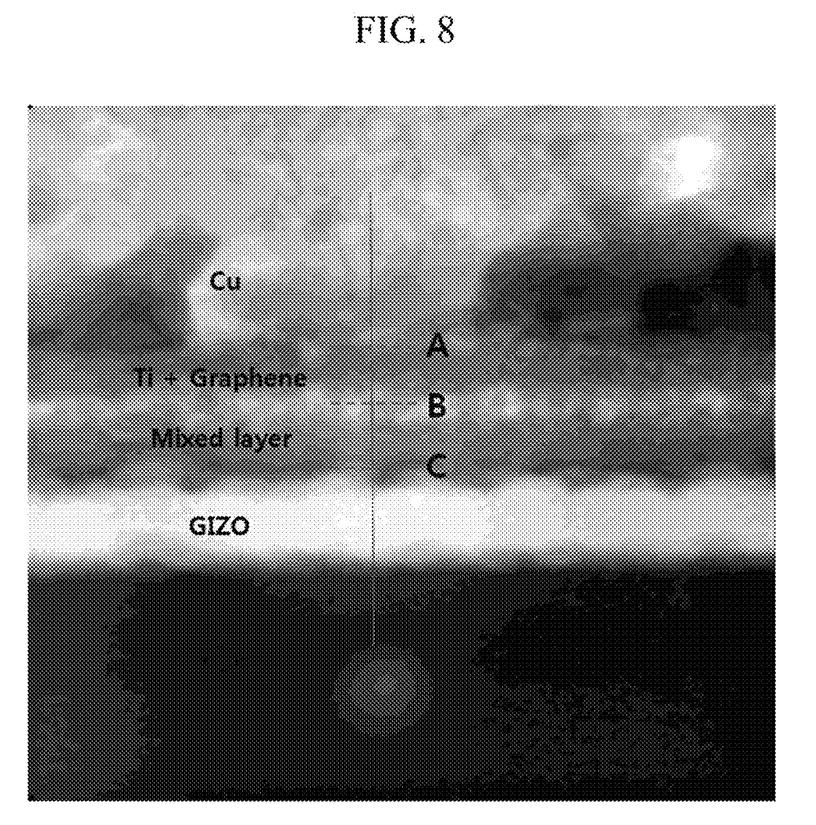
FIG. 8 is an electron micrograph of the thin film transistor, according to an exemplary embodiment of the present invention.
Figure 9:
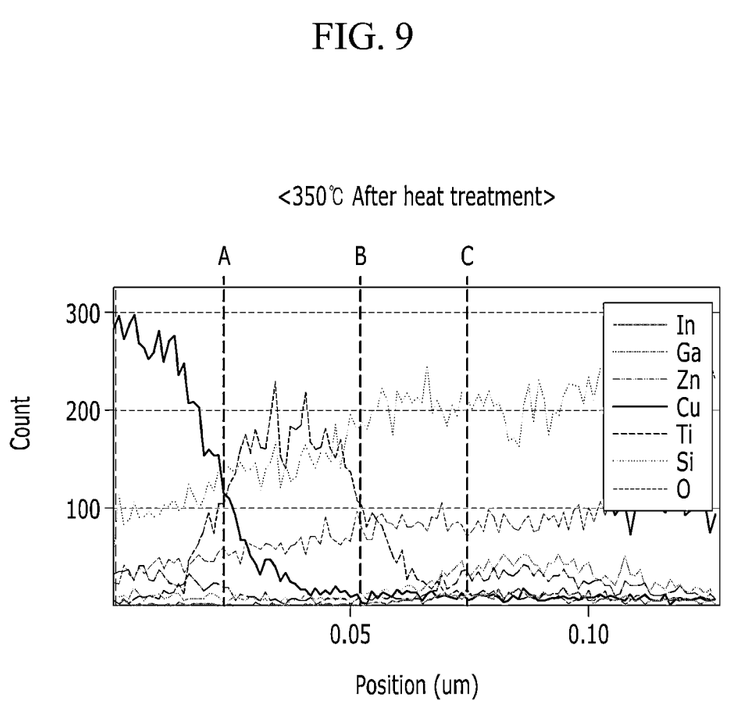
FIG. 9 is a graph illustrating a count of constituent materials of a thin film transistor after heat treatment according to A, B, and C positions of FIG. 8.

FIG. 8 is an electron micrograph of the thin film transistor, according to an exemplary embodiment of the present invention. FIG. 9 is a graph illustrating a count of constituent materials of a thin film transistor after heat treatment according to A, B, and C positions of FIG. 8.

Referring to FIG. 8 and FIG. 9, a count of copper after heat treatment does not differ very much as compared with the count of copper before heat treatment. In particular, since the count of copper is rapidly reduced toward a first position A, a second position B, and a third position C, it can be experimentally verified that graphene used to make a barrier layer is advantageous as a barrier layer.

Figure 10:
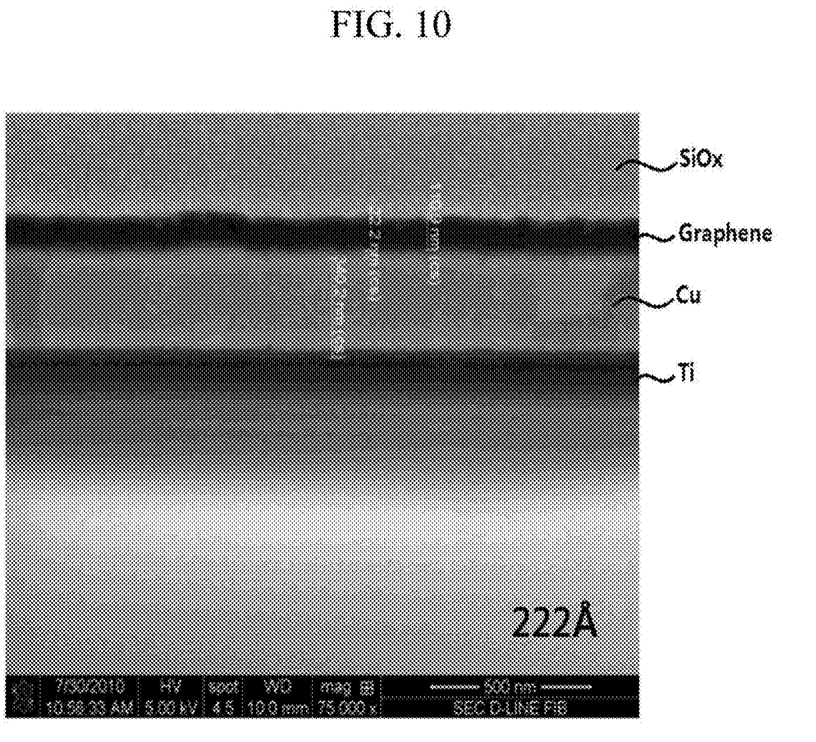
FIG. 10 is an electron micrograph of a thin film transistor structure using graphene as a capping layer, according to an exemplary embodiment of the present invention.

FIG. 10 is an electron micrograph of a thin film transistor structure using graphene as a capping layer, according to an exemplary embodiment of the present invention.

Referring to FIG. 10, a structure in which a capping layer made of graphene is formed on a layer made of titanium/copper and silicon oxide (SiOx) is shown. As shown in FIG. 10, adhesion between layers and a specific interface reaction is not observed. Accordingly, the capping layer made of graphene blocks diffusion of the metal material, and the lifting and corrosion of the wiring layer are also prevented.

Although FIGS. 1-5 show a bottom gate TFT, each exemplary embodiment of the present invention may also be applied to a top gate TFT.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
   a substrate;
   a gate electrode disposed on the substrate;
   a semiconductor layer disposed on the substrate, the semiconductor layer having a channel region;
   a source electrode and a drain electrode spaced apart from each other with respect to the channel region of the semiconductor layer;

an insulating layer disposed between the gate electrode and the semiconductor layer; and a barrier layer disposed between the semiconductor layer and the source electrode and between the semiconductor layer and the drain electrode, wherein the barrier layer comprises graphene, and wherein the barrier layer and the semiconductor layer face each other in a direction perpendicular to the substrate.

2. The thin film transistor of claim 1, further comprising:
a capping layer disposed on the source electrode and the drain electrode.

3. The thin film transistor of claim 2, wherein:
the capping layer comprises graphene.

4. The thin film transistor of claim 3, wherein:
the barrier layer contacts the source electrode and the drain electrode.

5. The thin film transistor of claim 4, further comprising:
a passivation layer disposed on the capping layer.

6. The thin film transistor of claim 5, wherein:
the passivation layer contacts an upper surface of the semiconductor layer corresponding to the channel region.

7. The thin film transistor of claim 3, wherein:
the semiconductor layer comprises an oxide semiconductor.

8. The thin film transistor of claim 7, wherein:
the semiconductor layer comprises at least one of zinc (Zn), indium (In), tin (Sn), gallium (Ga), and hafnium (Hf).

9. The thin film transistor of claim 3, wherein:
the semiconductor layer comprises amorphous silicon.

10. The thin film transistor of claim 9, further comprising:
an ohmic contact layer disposed between the semiconductor layer and the barrier layer.

11. The thin film transistor of claim 3, wherein:
the source electrode and the drain electrode comprise
a lower layer comprising at least one of copper, manganese, and titanium and
an upper layer disposed on the lower layer, and the upper layer comprising copper.

12. A thin film transistor array panel, comprising:
a substrate;
a gate line disposed on the substrate and a gate electrode, the gate line and the gate electrode being connected to each other;
a gate insulating layer disposed on the gate line and the gate electrode;
a semiconductor layer disposed on the gate insulating layer;
a data line disposed on the semiconductor layer and a source electrode connected to the data line;
a drain electrode spaced apart from the source electrode;
a passivation layer disposed on the data line, the source electrode, and the drain electrode and having a contact hole;
a pixel electrode disposed on the passivation layer and connected to the drain electrode through the contact hole; and
a barrier layer disposed between the semiconductor layer and the source electrode, and between the semiconductor layer and the drain electrode,
wherein the barrier layer comprises graphene.

13. The thin film transistor array panel of claim 12, further comprising:
a capping layer disposed between the source electrode and the passivation layer and between the drain electrode and the passivation layer.

14. The thin film transistor array panel of claim 13, wherein:
the capping layer comprises graphene.

15. The thin film transistor array panel of claim 14, wherein:
the barrier layer contacts the source electrode and the drain electrode.

16. The thin film transistor array panel of claim 15, wherein:
the passivation layer contacts an upper surface of the semiconductor layer, the semiconductor layer having a channel region.

17. The thin film transistor array panel of claim 14, wherein:
the semiconductor layer comprises an oxide semiconductor.

18. The thin film transistor array panel of claim 17, wherein:
the semiconductor layer comprises at least one of zinc (Zn), indium (In), tin (Sn), gallium (Ga), and hafnium (Hf).

19. The thin film transistor array panel of claim 14, wherein:
the semiconductor layer comprises amorphous silicon.

20. The thin film transistor array panel of claim 19, further comprising:
an ohmic contact layer disposed between the semiconductor layer and the barrier layer.

21. The thin film transistor array panel of claim 12, wherein:
the source electrode and the drain electrode comprise:
a lower layer comprising at least one of copper, manganese, and titanium and
an upper layer disposed on the lower layer, the upper layer comprising copper.

* * * * *